(12) United States Patent
Delapierre et al.

(10) Patent No.: US 8,349,660 B2
(45) Date of Patent: Jan. 8, 2013

(54) CAVITY CLOSURE PROCESS FOR AT LEAST ONE MICROELECTRONIC DEVICE

(75) Inventors: Gilles Delapierre, Seyssins (FR); Bernard Diem, Echirolles (FR); Francois Perruchot, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 536 days.

(21) Appl. No.: 12/693,867

(22) Filed: Jan. 26, 2010

(65) Prior Publication Data
US 2010/0190301 A1 Jul. 29, 2010

(30) Foreign Application Priority Data
Jan. 28, 2009 (FR) .................................... 09 50494

(51) Int. Cl.
*H01L 21/00* (2006.01)
(52) U.S. Cl. ........ 438/124; 438/106; 438/107; 438/127; 257/E21.502; 257/E21.509
(58) Field of Classification Search .................. 438/106, 438/107, 121, 124–127; 257/E21.502, E21.509
See application file for complete search history.

(56) References Cited

U.S. PATENT DOCUMENTS

| 7,232,754 B2 * | 6/2007 | Kirby et al. | 438/667 |
| 7,863,070 B2 * | 1/2011 | Colgan et al. | 438/51 |
| 2005/0067688 A1 * | 3/2005 | Humpston | 257/704 |
| 2007/0218585 A1 | 9/2007 | Robert | |
| 2007/0235501 A1 | 10/2007 | Heck | |
| 2008/0000948 A1 | 1/2008 | Blanc et al. | |
| 2009/0174148 A1 | 7/2009 | Bischof et al. | |

FOREIGN PATENT DOCUMENTS

| DE | 10 2005 060 870 A1 | 6/2007 |
| EP | 1 834 924 A2 | 9/2007 |
| FR | 2 870 227 | 11/2005 |

* cited by examiner

*Primary Examiner* — Leonard Chang
(74) *Attorney, Agent, or Firm* — Oblon, Spivak, McClelland, Maier & Neustadt, L.L.P.

(57) ABSTRACT

A process for closure of at least one cavity intended to encapsulate or be part of a microelectronic device, comprising the following steps:
a) Producing a cavity in a first substrate comprising a first layer traversed by an opening forming an access to the cavity;
b) Producing a portion of bond material around the opening, on a surface of the first layer located on the side opposite the cavity;
c) Producing, on a second substrate, a portion of fusible material, with a deposition of the fusible material on the second substrate and the use of a mask;
d) Placing the portion of fusible material in contact with the portion of bond material;
e) Forming a plug for the opening, which adheres to the portion of bond material, by melting and then solidification of the fusible material;
f) Separating the plug and the second substrate.

19 Claims, 7 Drawing Sheets

CAVITY CLOSURE PROCESS FOR AT LEAST ONE MICROELECTRONIC DEVICE

TECHNICAL FIELD

This document relates to the field of microelectronic devices, or chips, such as micro-electromechanical systems (MEMS) and/or nano-electromechanical systems (NEMS). In particular this document relates to a collective encapsulation process for a plurality of MEMS or NEMS type devices made on a single substrate.

STATE OF THE PRIOR ART

In order to reduce the cost of producing MEMS type microelectronic devices, it is useful to reduce the size of the devices in order to have the largest possible number on a single substrate and therefore reduce the cost thereof. It is also useful to use collective fabrication processes for the fabrication of these devices, especially by including therein and encapsulation step which is very costly if it is done individually for each device after dicing the substrate. The encapsulation step consists of sealing a cover on top of one or more microelectronic devices in order for them to be isolated from the outside environment in a cavity.

One of the means for preserving the performance of a microelectronic device despite its miniaturization is to always control more tightly the atmosphere in which the device is arranged. Such a MEMS type microelectronic device is a moving mechanical object whose properties are very dependent on the surrounding atmosphere. In particular, the thermomechanical noises of the suspended masses that a device may have is directly linked to the quality factor of this device and therefore to the damping from the gas present in the cavity in which the device is located. A small damping for example results from the highest possible vacuum. In other cases, a high damping may be useful for limiting the bandwidth of the device and reducing the sensitivity thereof to shocks. This high damping may result from a pressure around the device which is about atmospheric pressure. The desired atmosphere in the cavity in which the device is located may therefore range from a very high vacuum to have a low noise and very narrow resonance peaks, to several bars to have a high damping and a reduction of the cutoff frequencies.

It is possible to achieve the encapsulation of a MEMS type device by implementing a single step which simultaneously assures the sealing of the cover and controlling the pressure inside the cavity. Such an encapsulation however involves severe constraints for assuring the compatibility of these two functions because in this case, it is necessary that the device be released before the sealing step and that the sealing operation be compatible with the environment desired for the device (vacuum or specific atmosphere). These constraints are very limiting and reduce the number of techniques which can be used.

The encapsulation of a MEMS type device may also be implemented in two steps: protection of the device by sealing of the cover while retaining small openings, generally in the form of holes or trenches, and then the closure of these openings under controlled atmosphere. In this case, the sealing of the cover may be done before the release of the device. The freedom in the preparation conditions of the surfaces is thus greatly improved. The release of the device is done after the sealing of the cover, by chemical attack through openings maintained for this purpose. The sealing may also be done after release, with the atmospheric and temperature conditions during the sealing operation then being optimally chosen. In this case, the encapsulation is done in two main steps:
  transfer a covering substrate or deposit a thin layer for creating the cavity, where this substrate or layer comprises openings;
  plugging, or closing, the openings in an environment corresponding to that desired for the cavity (pressure and/or specific gases).

Separating the functions of covering and closing the cavity makes it possible to seal the cover with few restrictions on the ambient atmosphere.

The substrate transfer may be done by various sealing types: by fusible glass strip, by Au—Si eutectic layer, by direct Si/SiO$_2$ bonding, or even by anodic welding (or anodic bonding) of glass on silicon (simultaneous application of a high voltage and high temperature). This sealing is generally done at a temperature included between about 200° C. and 1000° C., and more commonly around 400° C.

An alternative to the transfer of a substrate consists of depositing a thin layer over a layer referred to as sacrificial which covers the active part of the chip. This sacrificial layer is then etched by chemical attack through a hole. The part left empty by the sacrificial layer forms the cavity.

All that is left is to plug the hole while subjecting the cavity to the desired pressure. Several types of plugs may be used.

For that, it is possible to transfer another substrate over the cover, with the disadvantages of the cost of the additional substrate, the high temperature of the sealing, and the need for a very high quality polishing. This technique is reserved for the case where the cover itself is a silicon substrate. This technique also has the drawback of adding an additional thickness (corresponding to that of the transferred substrate) to the device and therefore increasing its bulk.

It is also possible to accomplish the plugging by depositing a thin layer, for example based on silicon nitride or polycrystalline silicon, on the cover in order to progressively block the hole. The plugging is then done while depositing the thin layer, once the thickness becomes sufficient. This technique is however limited to very small diameter holes (a few microns) and can only be used with MEMS devices which can tolerate a cavity pressure equal to the pressure in the deposit chamber. This is extremely limiting and only relates to MEMS devices using pressures of a few millibars. Moreover, this technique is more difficult to use for the transferred substrate type covers because there is no surface for deposit at the bottom of the hole near the surface of the hole, with the deposit time before plugging of the hole then becoming very long.

It is also possible to accomplish the plugging by depositing a fusible mineral layer (generally phosphosilicate glass, borophosphosilicate glass, etc.) on the periphery of the hole, and then performing a high temperature reflow of this layer for plugging the hole with a thick flow towards the center of the hole. This technique makes it possible to use varied cavity pressures (at the time of reflow), but however needs a higher melting temperature for the mineral layer, of about 900° C., which is incompatible with many MEMS devices, especially those incorporating a CMOS circuit. Further the cavity is plugged when the device is at a high temperature and therefore degassing, which makes it difficult to obtain very high vacuums.

According to another plugging technique, it is possible to deposit a layer of low melting point metal (typically tin/lead or gold/tin based) around the hole and melt the deposited metal with the hope that under the effect of capillarity, it will gather in a single drop above the hole and close it. This technique could make it possible to obtain varied pressures at relatively low temperature in the cavities. However, a major disadvantage is that a relatively thick layer of fusible metal must be deposited for the drop to have a chance of plugging the hole. This is obtained by methods for electrolytic deposition in a liquid medium, which in most cases is not acceptable for the already released MEMS device, which must not be polluted by the various chemical agents in the electrolytic solution. The metal around the hole must additionally have a ribbon shape, which supposes the use of photosensitive resins for defining the shape, where the technology is again incompatible with the presence of holes on the cover. Another strong limitation, this technique does not work for trench shaped openings, because the melted metal in this case will have a tendency to gather along the ribbon instead of above the trench. Even in the case of a cylindrical hole, it will need to have very small dimensions for plugging to be achieved.

Finally it is also possible to manually deposit fusible metal beads on the hole and melt these beads which then weld to a metal ribbon previously deposited and etched around the whole. This solution eliminates the disadvantage of the penetration of liquid in the cavity of the device. It however has the disadvantage of using individual manual operations when one wants to plug the holes in covers of a plurality of devices, which is contrary to the objective of using microtechnologies for cost reduction. This technique is also poorly suited to plugging trenches.

BRIEF DESCRIPTION OF THE INVENTION

Thus, there is a need to propose a process for closing at least one cavity for at least one microelectronic device which is compatible with the collective closure of a plurality of cavities, for example for implementing collective encapsulation of a plurality of microelectronic devices at low cost, and not having the disadvantages from the prior art.

To do that, one embodiment proposes a process for closing at least one cavity for at least one microelectronic device, comprising at least the following steps:

a) Producing at least one cavity in a first substrate comprising at least one first layer traversed by at least one opening forming an access to the cavity;

b) Producing at least one portion of bond material, or adhesion material, around the opening, on or against a face of the first layer located on the side opposite the cavity;

c) Producing, on a second substrate, at least one portion of fusible material, for example with a deposition of the fusible material on the second substrate and the use of a mask;

d) Placing the portion of fusible material in contact with the portion of bond material;

e) Forming a plug for the opening, which adheres to the portion of bond material, by melting and then solidification of the fusible material;

f) Separating the plug and the second substrate.

Microelectronic device is understood to mean a device comprising micron or nanometer sized elements. The devices may, for example, be MEMS or NEMS such as pressure transducers, inertial sensors, resonators, etc.

Further, the first and/or second substrate may be homogeneous or heterogeneous structures, formed from one or more layers (stacking) of similar or different materials.

The first substrate may be an assembly of several layers and comprise for example microelectronic devices arranged in the cavity and possibly a cover or membrane on top of the cavity.

For example, this process may be applied for encapsulating one or more microelectronic devices arranged in one or more cavities which are intended to be closed by the process according to the invention. The process may also be used to close one or more cavities which are part of one or more microelectronic devices, for example a device comprising a membrane forming a wall of the cavity.

When the first substrate comprises a cover, the first substrate may have a structure thereby forming at least one part of the cavity.

The process is especially interesting for implementing a collective closure of a plurality of cavities.

Furthermore, this process is technically and economically very attractive because of the following advantages:

Because of the use of the second substrate comprising the portion(s) of fusible material, this method may achieve the collective closure of one or more cavities in which a plurality of microelectronic devices made collectively are located, before dicing the first substrate;

This process consumes little surface area on the first layer which may form a cover for the cavity, and is therefore compatible with an increasing reduction of the size of microelectronic devices;

The process is compatible with a control of the pressure inside the cavity at the moment of sealing, meaning the closure of the opening(s) formed in the first layer;

The process is capable of guaranteeing a very good hermetic seal over very long times (20 years and more) in severe temperature and humidity environments because of the welding of the plug(s) on the first layer;

The process generates few parasitic stresses on the microelectronic device and does not limit the design of the device itself;

The process is compatible with steps performed at low temperatures, for example below about 400° C., and may therefore be implemented when one or more integrated electronic circuits, for example CMOS type, are present on the microelectronic device(s);

The plugs(s) made do not form major excess thickness, which reduces the bulk of the encapsulated microelectronic device(s);

The process is compatible with the use of very low degassing and very high sealing metallic sealing material, especially when a high vacuum must be achieved in the cavity;

The process does not involve a liquid phase on the already machined and released microelectronic device;

The process is compatible with all forms of openings made in the first layer, for example holes or trenches, thanks to the fact that the fusible material is formed on the second substrate with the use of a mask, which may be a deposition mask or an etching mask, in which one or several openings of any pattern may be made;

The process has the possibility of having a prolonged degassing before a quick closure of the cavity;

The process is also compatible with making cavities at different pressures, for example when accelerometers needing to operate at atmospheric pressure and gyrometers needing to operate under vacuum reside on a single substrate.

Furthermore, the second substrate may then be reused for carrying out a new assembly or implementing another process for closure of the cavities.

Moreover, since the fusible material is deposited on the second substrate before forming the plug, the fusible material may adhere to the second substrate, which allows placing the portion of the fusible material in contact with the portion of bond material by placing the first substrate above or below the second substrate.

Bond material, or adhesion material, is understood to be a material on which the fusible material, when it is melted, is wettable, meaning on which the fusible material spreads and attaches when it is melted. This bond is also found when the fusible material cools to become a solid again, the bond material then forming a surface to which the fusible material is welded.

Furthermore, by using a fusible material between the opening to be closed and the second substrate, this process makes it possible to auto-align this opening with said fusible material while implementing step e) to form the plug, because, especially, of the capillary forces appearing when the fusible material is melted. The second substrate also auto-aligns with the first substrate during sealing of the cavity.

This process is applicable for example to an encapsulation over an immobilized structure, when the microelectronic device(s) is/are not yet released when the cover, formed at least in part by the first layer, is formed over the devices. In this case, the opening formed in the cover may be used for etching the material immobilizing the microelectronic devices. This process is also applicable to an encapsulation over a released structure where the release of the microelectronic device(s) is done in advance of the sealing of the cover.

The bond material may be a titanium, gold and nickel-based alloy, or a titanium, gold and palladium-based alloy, or a titanium, gold and platinum-based alloy, and/or the fusible material may be tin and/or gold and/or indium and/or nickel-based.

The microelectronic device may be MEMS type.

The first layer may be an electrically insulating layer placed over or against a semiconducting layer also forming a part of the first substrate, with the opening additionally traversing the semiconducting layer.

The opening may be a hole or trench, for example a somewhat complex geometric shape.

The process may additionally comprise, before step c) producing the fusible material portion on the second substrate, a step implementing a second portion of bond material against the second substrate, the portion of fusible material next being made on the second substrate by covering over the second portion of bond material.

Step c) producing the fusible material portion may be obtained by implementing the following steps:
  Depositing a sublayer based on at least one electrically conducting material covering the second portion of bond material and the second substrate;
  Producing, on the sublayer, the mask comprising at least one opening forming a location for the fusible material portion;
  Depositing the fusible material in the opening of the mask, against the sublayer, by electrolysis;
  Removing the mask and portions of the sublayer not covered by the fusible material portion.

The electrically conducting material from the sublayer may be a fusible material, and for example of similar nature to the fusible material deposited by electrolysis, thereby making it possible to obtain a homogeneous plug formed by the melting of the fusible material portion and the material from the sublayer.

In a variant, step c) producing the fusible material portion may be obtained by implementing the following steps:
  Producing, on the second substrate, the mask comprising at least one opening forming a location for the fusible material portion;
  Depositing the fusible material in the opening of the mask;
  Removing the mask.

Step c) producing the fusible material portion may be obtained by implementing the following steps:
  Depositing a layer based on the fusible material, on the second substrate;
  Producing the mask on the layer based on the fusible material;
  Etching of the layer based on the fusible material according to a pattern of the mask, forming the fusible material portion;
  Removing the mask.

The deposition of the fusible material may be a deposition by evaporation or cathodic sputtering, for example an under vacuum deposition.

The second substrate may comprise a support placed against a layer based on a material which may be selectively etched relative to the support material.

The step f) separating the plug and the second substrate may be done by a step of etching of the second layer.

The step f) separating the plug and the second substrate may be done by pulling the second substrate away from the plug, and possibly before a full solidification of the plug (in this case the solidification of the fusible material in step e) is only partial).

Before step d) placing the fusible material portion in contact with the bond material portion, the first and second substrate may be placed in an environment with controlled pressure and/or under controlled gaseous atmosphere.

The surface area of the fusible material portion and the surface area of the bond material portion intended to be brought into contact with each other during step d) may be substantially equal to each other.

A cycle comprising implementation of steps b) to f) may be repeated several times, making several successive plugs for various openings traversing the first layer, and in which, for each cycle, before the step d) of bringing into contact, the first and second substrate may be placed in an environment with controlled pressure and/or under controlled gaseous atmosphere which are different for each cycle, and in which the melting point of the fusible material used during one cycle may be less than the melting point of the fusible material(s) used during the previous cycle(s).

The invention also relates to a process for encapsulating at least one microelectronic device arranged in a cavity, comprising implementation of a process for closure of at least one cavity such as described above.

BRIEF DESCRIPTION OF THE DRAWINGS

The invention will be better understood by reading the description of implementation examples given strictly for information and without any limitation by referring to the attached drawings in which.

Identical, similar or equivalent parts of the various figures described below bear the same reference numbers to make moving from one figure to the other easier.

The various parts shown in the figures are not necessarily shown to the same scale in order to make the figures easier to read.

It must be understood that the various possibilities (variants and embodiments) are not exclusive of each other and can be combined.

DETAILED DESCRIPTION OF SPECIFIC EMBODIMENTS

Refer to FIGS. 1A and 2 to 9 which show steps of an encapsulation process for a plurality of microelectronic devices 100, 102 and 104, MEMS type in this example, according to a specific embodiment. These devices are for example accelerometers, gyrometers, RF switches, resonators or any other type of device which needs to be encapsulated to operate.

Figure 1A:
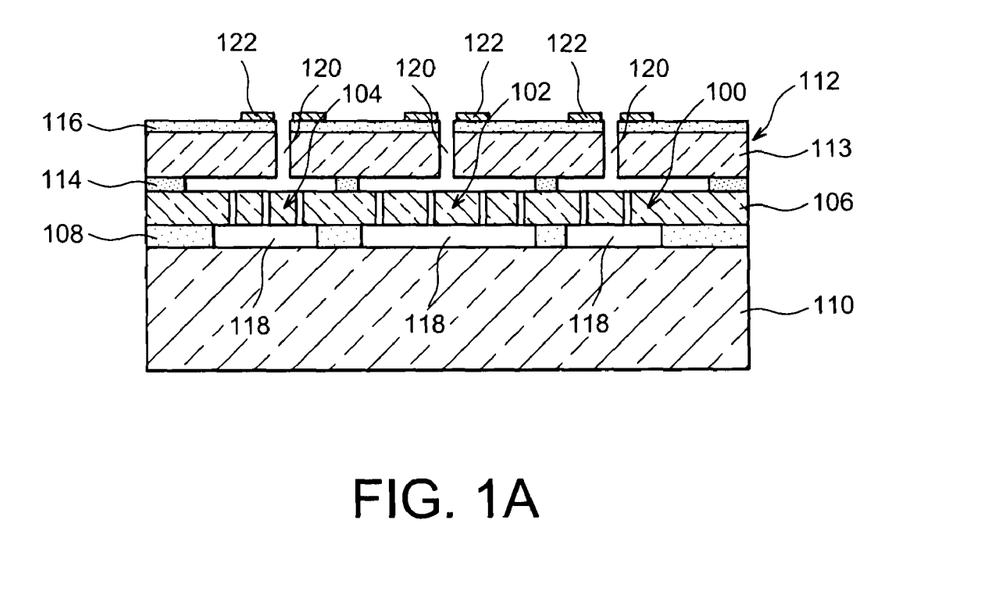
FIGS. 1A, 1B and 2 to 9 show steps of a cavity closure process according to a specific embodiment.

As shown in FIG. 1A, these three MEMS devices 100, 102 and 104 are made in a surface layer 106, for example silicon-based, of a first substrate also comprising a dielectric layer 108, for example $SiO_2$-based, placed between the surface layer 106 and a support layer 110 also silicon-based.

The devices 100, 102 and 104 are protected by a cover 112 which is part of the first substrate and formed in particular of a layer 113 based on a semiconductor such as silicon, placed above the devices 100, 102 at 104 and connected to the surface layer 106 by means of an interface layer 114, for example based on a dielectric which could be similar to the material of the dielectric layer 108. Advantageously, the cover 112 also comprises an electrically insulating layer 116 formed against the surface of the layer 113 opposite from that in contact with the interface layer 114. Therefore, each of the devices 100, 102 and 104 is arranged in a cavity 118 closed by the cover 112. The assembly thus formed, shown in FIG. 1A, constitutes a first substrate.

Such a structure may for example be obtained by first making the devices 100, 102 and 104 from an SOI substrate formed by the layers 106, 108 and 110 by using photolithography and etching steps in the surface layer 106. The interface layer 114 is next deposited on the surface layer 106 including on the devices 100, 102 and 104. The layer 113 is next deposited on the interface layer 114, and then the insulating layer 116 is deposited on the layer 113. Openings 120 are next made through the insulating layer 116 and the layer 113, in the area of each of the devices 100, 102 and 104, in order to access the interface layer 114. Selective etching of the material of the interface layer 114 and the dielectric layer 108 is done thereby forming cavities 118 around each device 100, 102 and 104.

In the example described here, the openings 120 have a substantially cylindrical shape traversing the cover 112. All the same, the shape of the openings 120 is adapted according to the shape and dimensions of the cavities to be made, and therefore the shape and dimensions of the devices 100, 102 and 104. These openings 120 may therefore be for example trenches made through the cover 112, thereby making it possible to uncover a larger surface of the interface layer 114.

It now involves making the plugs for the openings 120 in order to close the cavities 118. To do that, first bond material portions 122 are made around the openings 120 by depositing a layer based on this bond material on the insulating layer 116 and then etching this layer to form the bond material portions 122. It is also possible to deposit and etch this layer of bond material after depositing the insulating layer 116 but before making the openings 120. In the example described here, the bond material used is a titanium, gold and nickel-based alloy, or a titanium, gold and palladium-based alloy, or even a titanium, gold and platinum-based alloy. These alloys have in particular good wetability and bonding properties with the fusible material which will be used in the remainder of the process.

In the example shown in FIG. 1A, the devices 100, 102 and 104 which are arranged in the cavities 118 formed in the first substrate are encapsulated.

Figure 1B:
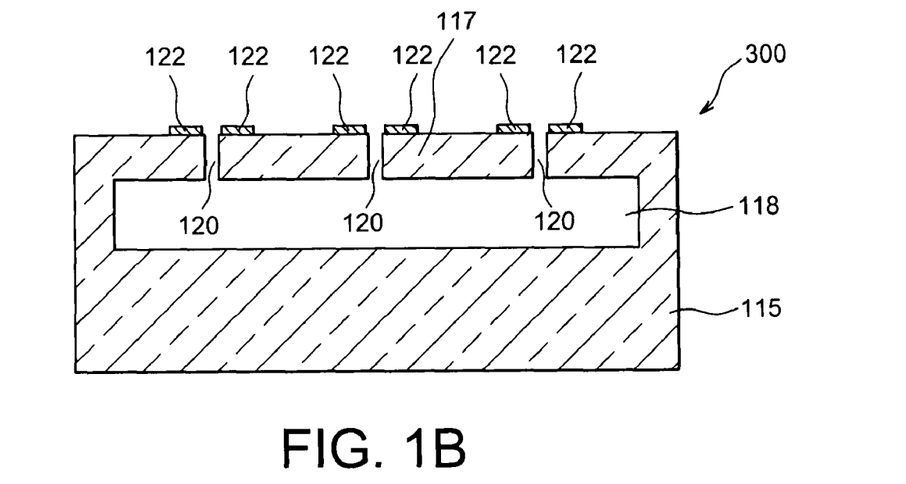

In a variant, the cavity closure process described here may be applied to the closure of a cavity which is part of a microelectronic device. As shown in FIG. 1B, a device 300, here a pressure sensor, is formed in a first substrate 115 comprising a layer 117. A cavity 118 is made in the layer 115; the upper wall of the cavity 118 is formed by the layer 117 which here plays the role of a pressure sensitive membrane. An opening 120 crosses the layer 117 and forms an access to the cavity 118. As described in the example from FIG. 1A, the portions 122 of bond material are formed around the opening 120.

Now the continuation of the process for forming the plugs for the cavities 118 shown in FIG. 1A is described. All the same, the closure of the cavity 118 of the device 300 may be done in a similar manner.

Figure 2:
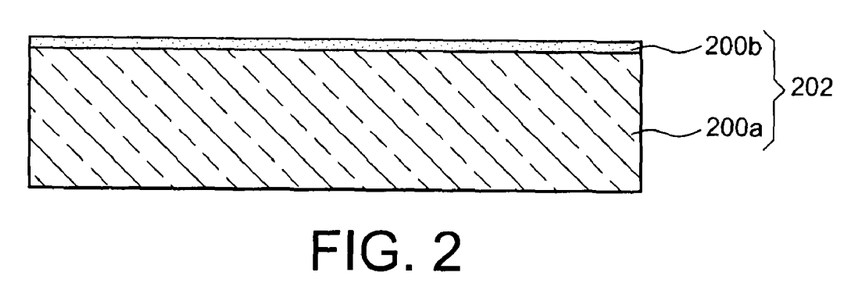
Figure 3:
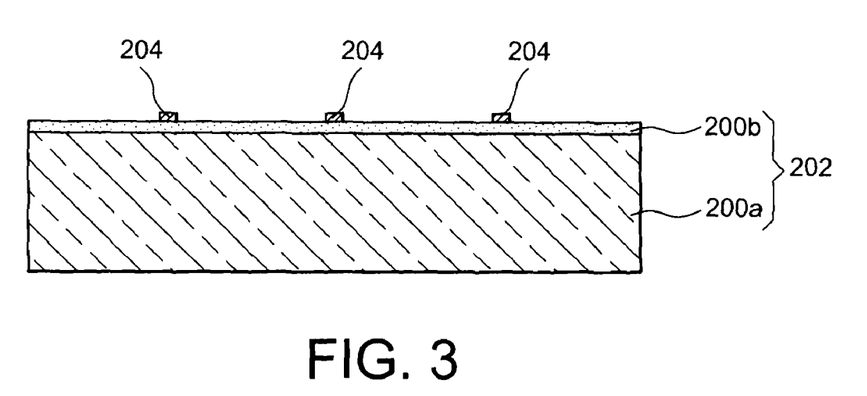

In parallel with the implementation of the structure previously described in connection with FIG. 1A (or that shown in FIG. 1B), a second structure is made which will be used for making the plug for the openings 120. As shown in FIG. 2, a surface layer 200b, based on $SiO_2$ or titanium for example, is made, for example by deposition, on a support 200a, for example semiconductor-based, here silicon. The sacrificial layer 200b and the support 200a form a second substrate designated by the reference 202.

Next a bond layer, for example based on an identical material to that used to form the bond portions 122 is deposited on the sacrificial layer 200b. This bond layer is next etched to leave behind only portions 204 of this bond layer in the area of the locations intended to receive the portions of fusible material which will be used for making the plugs for the openings 120 (see FIG. 3).

Figure 4:
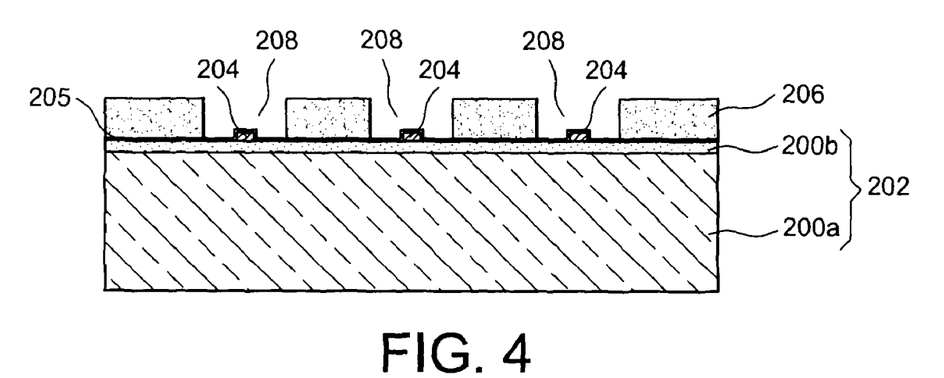

An electrolysis sublayer 205 is next deposited on the structure made, meaning covering the bond portions 204 and the sacrificial layer 200b. This electrolysis sublayer 205 is based on an electrically conducting material, and preferably based on a fusible material similar to that intended to be used for forming the fusible material portions which will be used for plugging the openings 120. A mask layer 206 is next deposited on the electrolysis sublayer 205. This mask layer 206 is next photolithographed and etched in order to form the locations 208, in the area of the bond portions 204, in the area of which the fusible material portions are intended to be made (FIG. 4).

Figure 5:
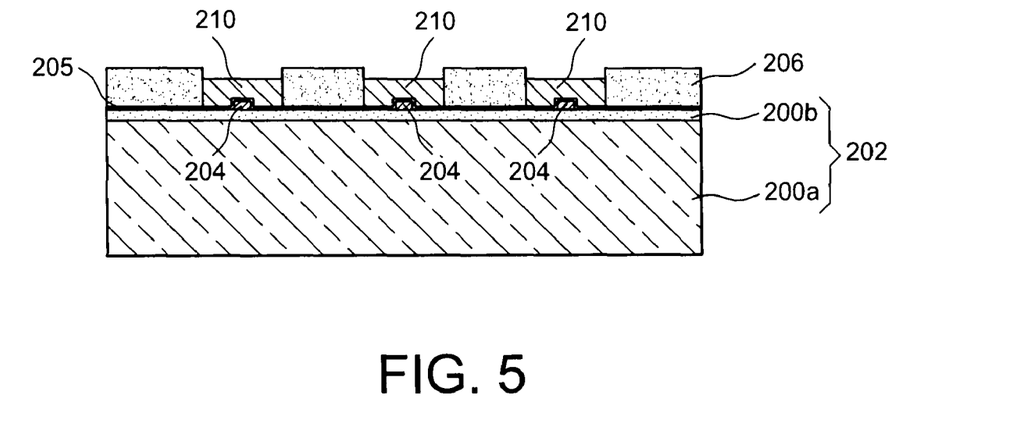

As shown in FIG. 5, portions of fusible material 210, based on material from the sublayer 205, are made next in the openings 208, on the electrolysis sublayer 205 by electrolysis. This fusible material is similar to the material from the electrolysis sublayer 205.

The shape and dimensions of the locations 208 are chosen as a function of the shape and dimensions of the fusible material portions 210 one wants to obtain, and therefore as a function of the shape and dimensions of the openings 120 that one wants to plug. In the embodiment described here, the dimensions of the bond material portions 204 are much less than that of the fusible material portions 210.

Figure 6:
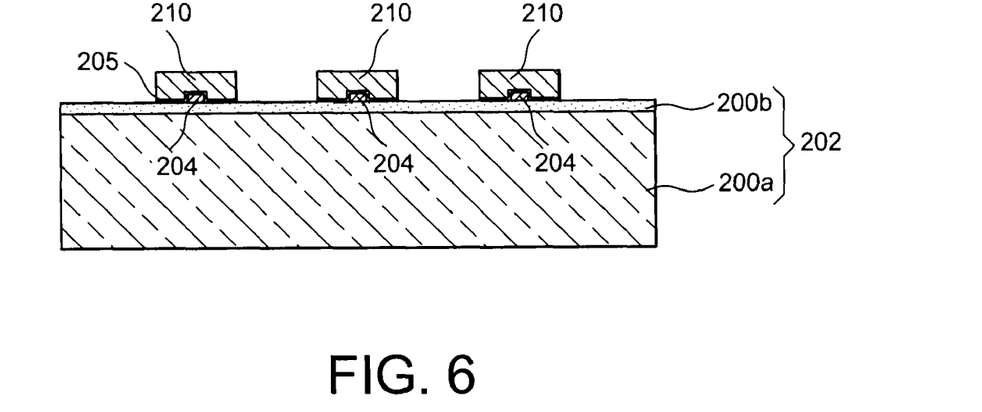

Finally, as shown in FIG. 6, the mask layer 206 is removed and the electrolysis sublayer 205 still present between the fusible material portions 210 is eliminated, for example by etching.

Figure 7:
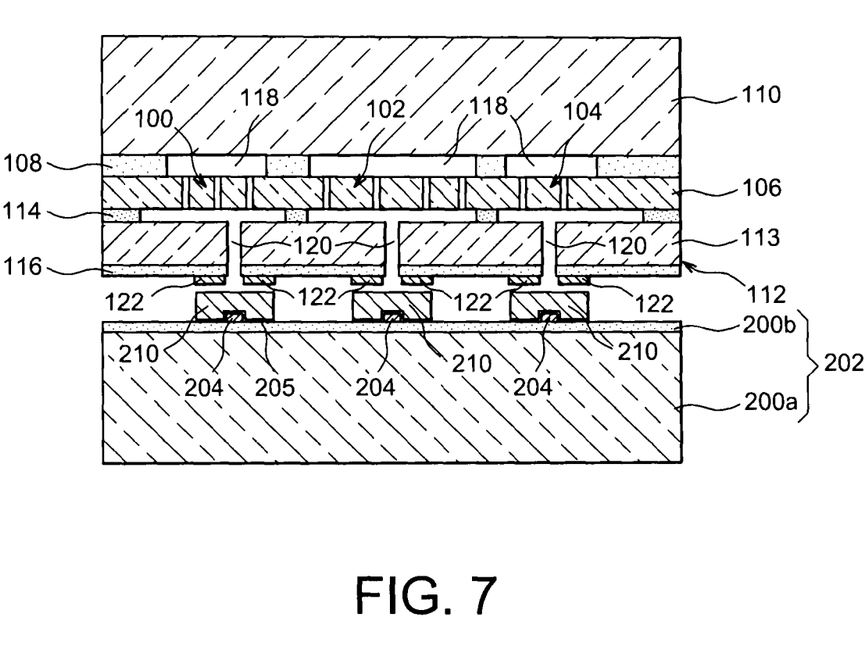

The first substrate comprising the devices 100, 102 and 104 is then turned over in order for the openings 120 to face and align with the fusible material portions 210 (see FIG. 7).

Should the devices 100, 102 and 104 be intended to operate in a specific environment (under vacuum or under atmosphere of a specific gas), the two substrates facing each other are then placed under vacuum or under a gaseous atmosphere in order for this specific environment to be found in the cavities 118.

Figure 8:
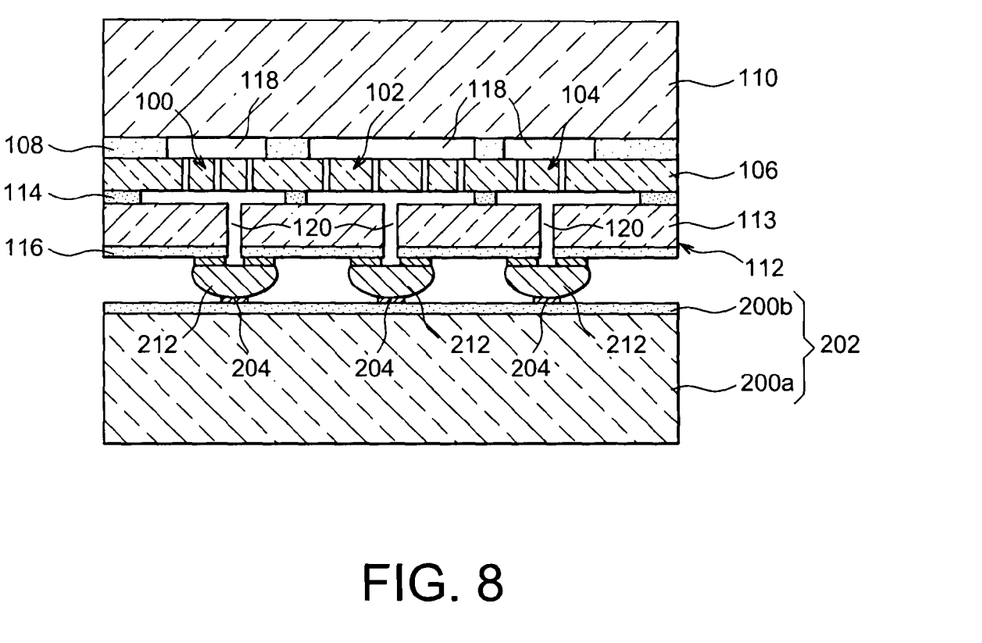

The fusible material portions 210 and the bond portions 122 are then brought in contact, and then the fusible material 210 along with the portions of the electrolysis sublayer 205 located under the fusible material portions 210 are melted, for example by heating. The fusible material portions 210 and the electrolysis sublayer 205 while melting wet the bond portions 122 and 204, and form plugs 212 closing the cavities 118. Auto-alignment of the plugs 212 relative to the openings 120 is automatically achieved because of the capillary forces appearing during the melting of the fusible material between this fusible material and the bond portions 122. The temperature is then lowered until the plugs 212 solidify.

Figure 9:
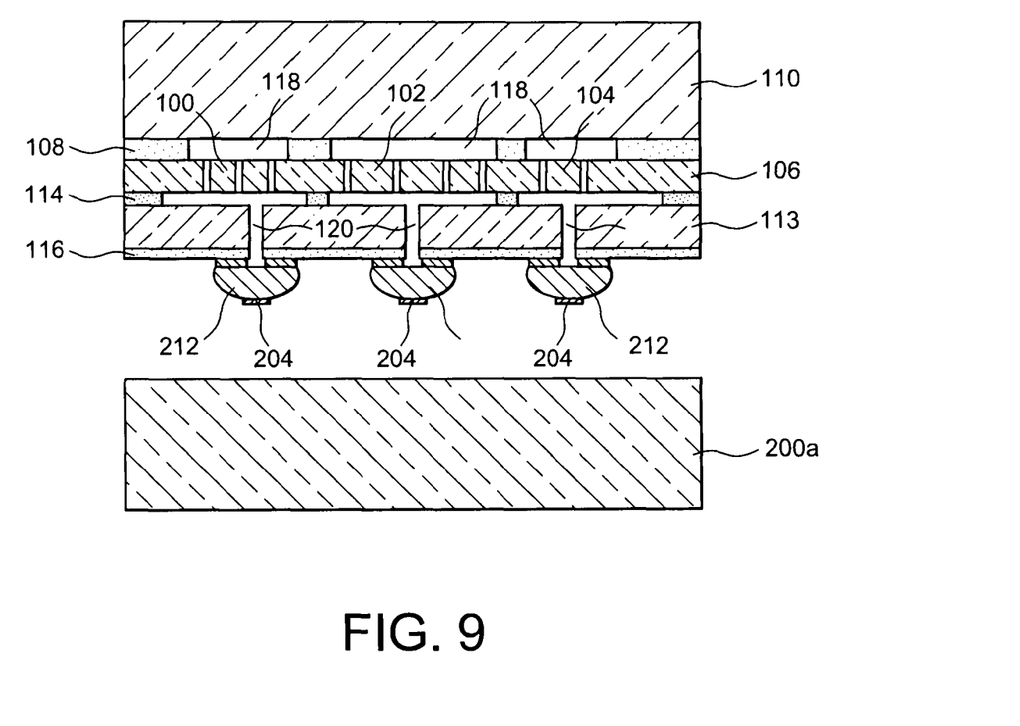

The support 200a and the plugs 212 are then separated by etching the sacrificial layer 200b (FIG. 9). Here the bond portions 204 remain rigidly connected to the plugs 212.

The choice of the material(s) for making the fusible material portions 210 (and therefore also the electrolysis sublayer 205) together with the bond material portions 122 is based especially as a function of the temperatures that the devices 100, 102 and 104 can tolerate during the melting of these materials. For example, the fusible material may be indium-based (melting point equal to about 150° C.) in the case where the devices 100, 100 to 104 only tolerate very low temperatures, based on a gold and tin alloy (melting point equal to about 260° C.) in the case where the devices 100, 102 and 104 tolerate medium temperatures, or even based on nickel and tin alloy (melting point equal to about 300° C.) when the devices 100, 102 and 104 tolerate higher temperatures.

As a variant, it is possible to block the cavities 118 at various pressures or with various gas environments, for example for two different types of devices. To do that, the steps previously described in connection with FIGS. 2 to 9 are repeated several times while blocking different cavities each time in gaseous environments or under various pressures. The fusible material used for each cycle of the plugging steps is in this case chosen with a lower melting point than the fusible material used in the previous plugging steps in order to not melt the plugs made during the previous plugging steps. To do that, the fusible materials used during the different cycles may be based on different alloys having different melting points; these differences may amount for example to several tens of degrees difference. It is for example possible to use a first alloy based on 95.5% tin, 3.5% aluminum and 1% copper when plugging a first series of openings. The melting point of such an alloy is included between about 235° C. and 245° C. During plugging second openings, a second alloy based on 63% tin and 37% lead, having a melting point included between about 215° C. and 225° C., could be used.

In the previously described example, a sacrificial layer 200b is used for separating the plugs 212 from the support 200a by etching this sacrificial layer 200b. However, in a variant, it is possible that this sacrificial layer 200b not be etched, but that it be pulled off from the plugs 212, preferably just before complete solidification of the plugs 212 because at that moment the binding forces between the bond portions 204 and the fusible material are still small even though the plug is close to the solid state. In this case, the bond portions 204 do not remain bonded to the solidified plugs 212 after the separation of the layer 202 from these plugs 212.

In a variant, it is possible that fusible material portions 210 are not obtained with electrolysis on the second substrate 202, but with a deposition, such as a vacuum deposition by evaporation or cathodic sputtering, thus allowing an adhesion of the fusible material portions 210 with the second substrate 202. In this variant, the electrolysis sublayer 205 is not produced, the mask 206 and fusible material portions 210 being directly deposited on the second substrate 202, for example on the sacrificial layer 200b and/or bond material portions 204.

In another alternative embodiment, it is possible that the fusible material portions are not made through a deposition mask, but with the use of an etching mask. In this case, the fusible material is first deposited, e.g. by evaporation or sputtering, as a layer on the second substrate. A lithographic mask is then produced on the layer of fusible material, this layer of fusible material being then etched according to the mask pattern to produce the fusible material portions.

Figure 10:
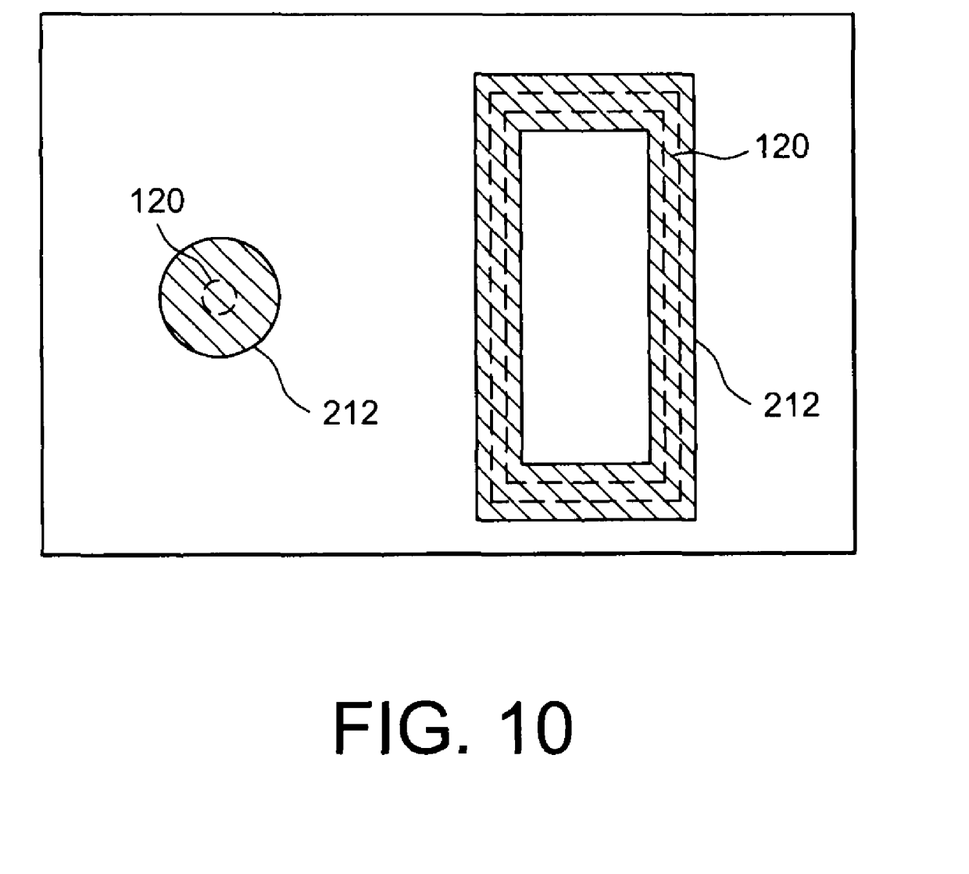
FIG. 10 shows different types of plugs can be obtained during the implementation of a cavity closure process according to a specific embodiment.

Whichever the embodiment, the cavity closure process described here allows to close, or plug, openings of any shape, or any pattern. Two examples of openings 120 are shown in FIG. 10: one (left) is a circular hole, the other (right) is a rectangular closed trench. We see that these openings 120 are each closed by a plug 212 of a shape which is adapted to the shape of the opening 120. The shape of the plug 212 corresponds to the shape of the opening made through the mask which is used for depositing the fusible material on the second substrate or for etching the fusible material.

The invention claimed is:

1. A process for closing at least one cavity for at least one microelectronic device, comprising at least the following steps:
   a) Producing at least one cavity in a first substrate comprising at least one first layer traversed by at least one opening forming an access to the cavity;
   b) Producing at least one portion of bond material around the opening, on a face of the first layer located on the side opposite the cavity;
   c) Producing, on a second substrate, at least one portion of fusible material with a deposition of the fusible material on the second substrate and the use of a mask;
   d) Placing the portion of fusible material in contact with the portion of bond material;
   e) Forming a plug for the opening, which adheres to the portion of bond material, by melting and then solidification of the fusible material;
   f) Separating the plug and the second substrate.

2. The process according to claim 1, in which the bond material is a titanium, gold and nickel-based alloy, or a titanium, gold and palladium-based alloy, or a titanium, gold and platinum-based alloy, and/or the fusible material is tin and/or gold and/or indium and/or nickel-based.

3. The process according to claim 1, in which the microelectronic device is MEMS type.

4. The process according to claim 1, in which the first layer is an electrically insulating layer placed over a semiconducting layer also forming a part of the first substrate, with the opening additionally traversing the semiconducting layer.

5. The process according to claim 1, in which the opening is a hole or trench.

6. The process according to claim 1, comprising additionally, before step c) producing the fusible material portion on the second substrate, a step implementing a second portion of bond material against the second substrate, the portion of fusible material next being made on the second substrate by covering over the second portion of bond material.

7. The process according to claim 6, in which step c) producing the fusible material portion is obtained by implementing the following steps:
   Depositing a sublayer based on at least one electrically conducting material covering the second portion of bond material and the second substrate;
   Producing, on the sublayer, the mask comprising at least one opening forming a location for the fusible material portion;
   Depositing the fusible material in the opening of the mask, against the sublayer, by electrolysis;
   Removing the mask and portions of the sublayer not covered by the fusible material portion.

8. The process according to claim 7, in which the electrically conducting material from the sublayer is a fusible material.

9. The process according to claim 8, in which the fusible material from the sublayer is of similar nature to the fusible material deposited by electrolysis.

10. The process according to claim 1, in which step c) producing the fusible material portion is obtained by implementing the following steps:
Producing, on the second substrate, the mask comprising at least one opening forming a location for the fusible material portion;
Depositing the fusible material in the opening of the mask;
Removing the mask.

11. The process according to claim 10, in which the deposition of the fusible material is a deposition by evaporation or cathodic sputtering.

12. The process according to claim 1, in which step c) producing the fusible material portion is obtained by implementing the following steps:
Depositing a layer based on the fusible material, on the second substrate;
Producing the mask on the layer based on the fusible material;
Etching of the layer based on the fusible material according to a pattern of the mask, forming the fusible material portion;
Removing the mask.

13. The process according to claim 1, in which the second substrate comprises a support placed against a second layer based on a material which is selectively etched relative to the support material.

14. The process according to claim 13, in which the step f) separating the plug and the second substrate is done by a step of etching of the second layer.

15. The process according to claim 1, in which the step f) separating the plug and the second substrate is done by a step of pulling the second substrate away from the plug.

16. The process according to claim 1, in which before step d) placing the fusible material portion in contact with the bond material portion, the first and second substrate are placed in an environment with controlled pressure and/or under controlled gaseous atmosphere.

17. The process according to claim 1, in which the surface area of the fusible material portion and the surface area of the bond material portion intended to be brought into contact with each other during step d) are substantially equal to each other.

18. The process according to claim 1, in which a cycle comprising implementation of steps b) to f) is repeated several times, making several successive plugs for various openings traversing the first layer, and in which, for each cycle, before the step b) of bringing into contact, the first and second substrate are placed in an environment with controlled pressure and/or under controlled gaseous atmosphere which are different for each cycle, and in which the melting point of the fusible material used during one cycle is less than the melting point of the fusible material(s) used during the previous cycle(s).

19. A process for encapsulating at least one microelectronic device placed in a cavity, comprising the implementation of a closure process for at least one cavity according to claim 1.

* * * * *